United States Patent
Bhattacharjee et al.

(10) Patent No.: US 7,078,969 B2
(45) Date of Patent: Jul. 18, 2006

(54) ANALOG SIGNAL INTERPOLATION

(75) Inventors: Jishnu Bhattacharjee, San Jose, CA (US); Debanjan Mukherjee, San Jose, CA (US); Abhijit Phanse, Sunnyvale, CA (US)

(73) Assignee: Scintera Networks, Inc., San Jose, CA (US)

( * ) Notice: Subject to any disclaimer, the term of this patent is extended or adjusted under 35 U.S.C. 154(b) by 0 days.

(21) Appl. No.: 11/209,010

(22) Filed: Aug. 22, 2005

(65) Prior Publication Data

US 2006/0044167 A1    Mar. 2, 2006

Related U.S. Application Data

(63) Continuation of application No. 10/724,561, filed on Nov. 26, 2003, now Pat. No. 6,940,352.

(51) Int. Cl.
*H03F 3/45* (2006.01)

(52) U.S. Cl. .................. 330/254; 327/357; 327/359

(58) Field of Classification Search ............... 330/254; 327/357, 359

See application file for complete search history.

(56) References Cited

U.S. PATENT DOCUMENTS

| 4,156,283 | A | * | 5/1979 | Gilbert ..................... 708/835 |
| 5,959,491 | A | * | 9/1999 | Kang ....................... 327/359 |
| 6,100,760 | A | * | 8/2000 | Maruyama et al. ......... 330/254 |
| 6,239,645 | B1 | * | 5/2001 | Tsukahara et al. ......... 327/359 |
| 6,456,142 | B1 | * | 9/2002 | Gilbert ..................... 327/356 |
| 6,871,057 | B1 | * | 3/2005 | Ugajin et al. ............... 455/323 |

\* cited by examiner

*Primary Examiner*—Patricia Nguyen
(74) *Attorney, Agent, or Firm*—Jonathan W. Hallman; MacPherson Kwok Chen & Heid LLP

(57) ABSTRACT

A linear interpolator is provided that includes differential pairs of transistors biased such that a first input voltage may be multiplied by a factor r wherein $0 \leq r \leq 1$ and such that a second input voltage may be multiplied by the complement factor $(1-r)$. By combining the multiplied input voltages, a linear interpolation is provided based upon the factor r.

6 Claims, 4 Drawing Sheets

US 7,078,969 B2

ANALOG SIGNAL INTERPOLATION

RELATED APPLICATIONS

This application is a Continuation Application of U.S. patent application Ser. No. 10/724,561, filed Nov. 26, 2003 now U.S. Pat. No. 6,940,352. The contents of both applications are hereby incorporated by reference in their entirety.

TECHNICAL FIELD

This invention relates generally to the interpolation of analog signals, and more particularly to the linear interpolation of analog signals.

BACKGROUND

Interpolation of signals is widespread in fields such as image processing and communication. Accordingly, much effort has been expended in the development of methods and systems to perform the necessary interpolation. But this interpolation will generally occur digitally, i.e., either the desired amount of interpolation is a digital value and/or the signals being interpolated are digital signals. Surprisingly little development has occurred regarding the interpolation of analog signals.

This difference in the prior art between the development for interpolation of digital signals vs. the development for interpolation of analog signals is understandable given the widespread nature of digital systems. However, even in digital systems such as those used for digital communications, the need arises for interpolation of analog signals such as that which occurs in adaptive timing control and recovery schemes. Existing analog signal interpolators have proven to be inappropriate for use in these schemes because they typically provide non-linear interpolation that is subject to gain variation. However, linear interpolation is often required and is essential when implemented in adaptive timing control and recovery techniques.

Accordingly, there is a need in the art for improved techniques and devices for the linear interpolation of analog signals.

SUMMARY

In accordance with one aspect of the invention, a linear interpolator for interpolating a first input voltage $V_{in1}$ and a second input voltage $V_{in2}$ according to a factor r, wherein $0 \leq r \leq 1$ is provided. The interpolator includes a first differential pair of transistors adapted to split a differential current proportional to $V_{in1}$ such that a first transistor in the first differential pair conducts a differential current proportional to $r^*V_{in1}$ and a second transistor conducts a differential current proportional to $(1-r)^*V_{in1}$ and a second differential pair of transistors adapted to split a current proportional to $V_{in2}$ such that a first transistor in the second differential pair conducts a differential current proportional to $(1-r)^*V_{in2}$ and a second transistor in the second differential pair conducts a differential current proportional to $r^*V_{in2}$. Advantageously, a voltage generated from the sum of the differential currents proportional to $r^*V_{in1}$ and $(1-r)V_{in2}$ produces the desired linear interpolation.

In accordance with another aspect of the invention, a linear interpolator for interpolating a first input voltage $V_{in1}$ and a second input voltage $V_{in2}$ according to a factor r, wherein $0 \leq r \leq 1$ is provided. The linear interpolator includes a first differential pair adapted to split a current proportional to $r^2$ such that a first transistor in the first differential pair conducts a differential current proportional to $V_{in1}*r$ and a second transistor in the first differential pair conducts a differential current proportional to $-V_{in1}*r$; and a second differential pair adapted to split a current proportional to $(1-r)^2$ such that a first transistor in the second differential pair conducts a differential current proportional to $V_{in2}*(1-r)$ and a second transistor in the first differential pair conducts a differential current proportional to $-V_{in2}*(1-r)$.

DETAILED DESCRIPTION

Figure 1:
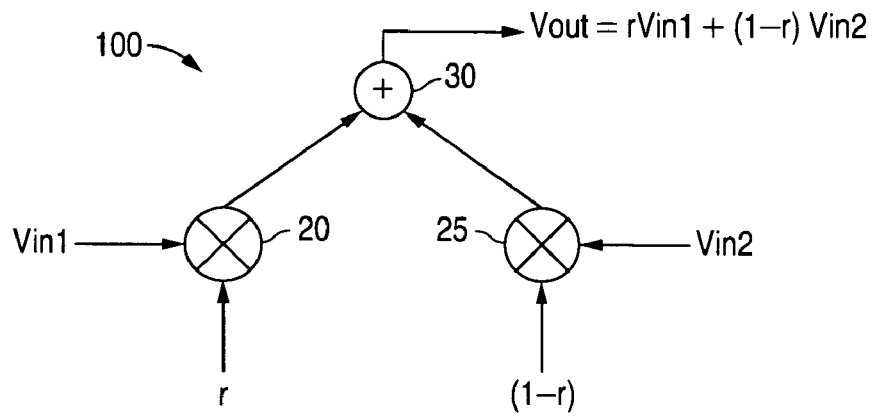
FIG. 1 is a conceptual illustration of a generic linear interpolator.

Referring now to FIG. 1, a linear interpolator 100 is provided for the linear interpolation of voltages $V_{in1}$ and $V_{in2}$. Interpolator 100 functions to provide an output voltage $V_{out}$ that is a linear interpolation of the two input voltages based upon a factor r that may range between 0 and 1. The input voltage $V_{in1}$ is multiplied by a linear interpolation factor "r" in a multiplier 20 whereas input voltage $V_{in2}$ is multipled by the complement factor (1−r) in a multiplier 25. The resulting outputs of multipliers 20 and 25 are summed in a summer 30 to produce an output voltage $V_{out}$ that equals the summation of $r^*V_{in1}$ and $(1-r)^*V_{in2}$. Linear interpolator 100 has many uses such as in a variable delay cell wherein $V_{in1}(t)$ equals $V_{in2}(t-j)$, where j is a variable delay factor.

Figure 2:
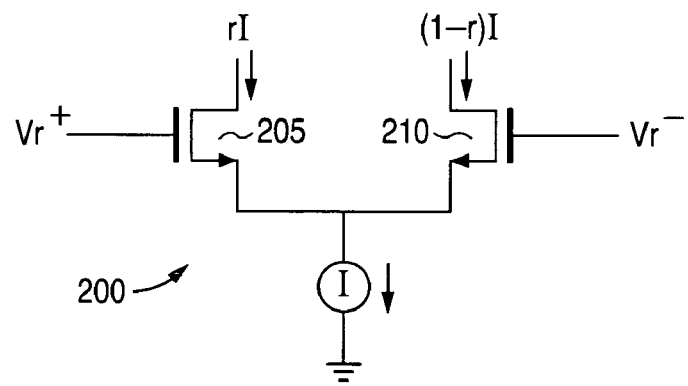
FIG. 2 is a schematic illustration of a differential pair of transistor used to split a current according to a desired splitting factor r in response to a splitting input voltage.
Figure 3:
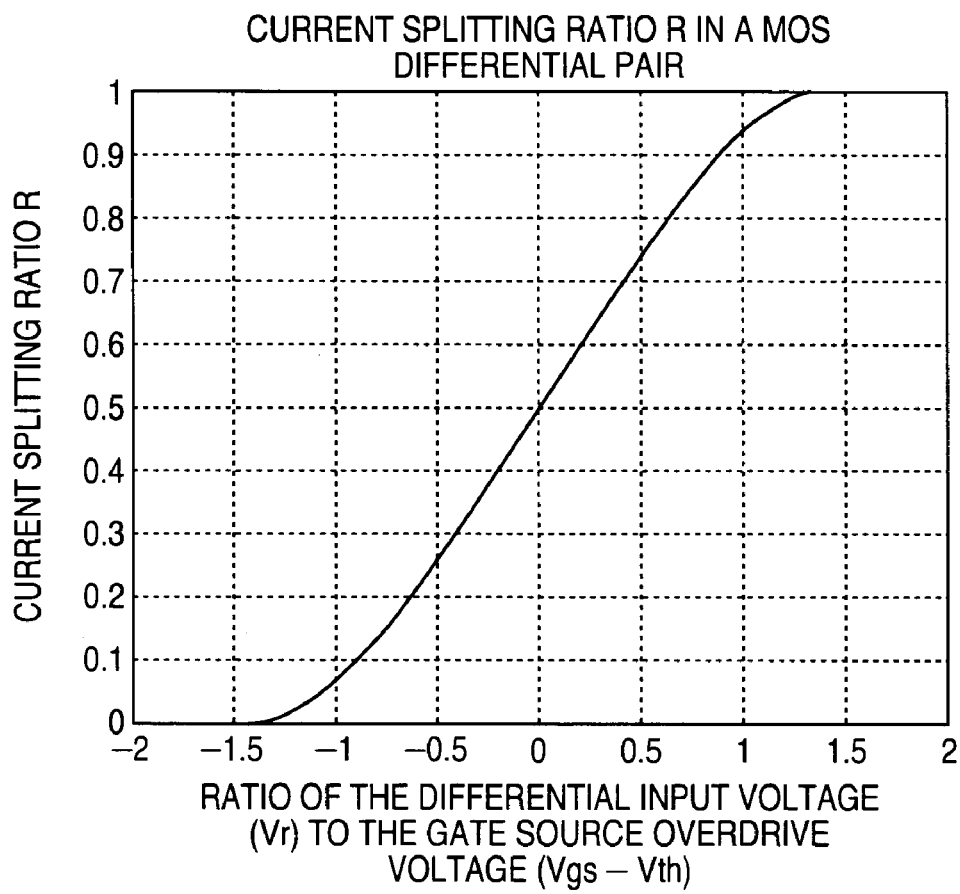
FIG. 3 is a graphical representation of the relationship between the splitting factor r and the ratio of the splitting input voltage to the overdrive voltage for the differential pair of FIG. 2.

To provide the interpolation according to variable factor r, linear interpolator 100 exploits the current splitting property of differential pairs. For example, a differential pair 200 of matched NMOS transistors is shown in FIG. 2. A current source I biases an NMOS transistor 205 and an NMOS transistor 210. The resulting current and gate-to-source voltage ($V_{gs}$) from this biasing will be the same for each transistor 205 and 210. A splitting voltage $V_r$ is applied across the gates of NMOS transistors 205 and 210. Thus, with respect to NMOS transistor 205, it is as if its bias voltage $V_{gs}$ has been altered by an additional voltage $V_{r+}$ equaling $V_r/2$. Similarly, with respect to NMOS transistor 210, it is as if its bias voltage $V_{gs}$ has been altered by the addition of a voltage $V_{r-}$ equaling $-V_r/2$, where $V_r=(V_{r+}-V_{r-})$. Because transistors 205 and 210 are matched, if the voltage $V_r$ is zero, each will conduct of I/2. However, as $V_r$ is increased positively from zero, more and more current will be steered to transistor 205 and away from transistor 210. In general, depending upon the value of $V_r$, an arbitrary portion r of current I flows in transistor 205 and the complement of this portion (namely, 1−r) of current I flows in transistor 210. It can be shown that the factor r is given by $$r = \frac{1}{2} * [1 + sqrt\{m*(1-m/4)\}] \quad \text{Eq (1)}$$

where the factor m is given by $$m = (V_r/\Delta V)^2 \quad \text{Eq. (2)}$$

and where the factor $\Delta V$ is denoted as the overdrive voltage and equals the difference between $V_{gs}$ and the transistors' 205 and 210 threshold voltage. As can be seen from equations (1) and (2), by proper selection of the splitting voltage $V_r$, the current splitting factor r may be arbitrarily varied in the range $0 \leq r \leq 1$. The variation of the splitting factor r as a function of $V_r/\Delta V$ is shown in FIG. 3. In addition, although described with respect to MOS transistors, equations analogous to equations (1) and (2) may be derived for the current splitting properties of differential pair of bipolar transistors as well.

Figure 4B:
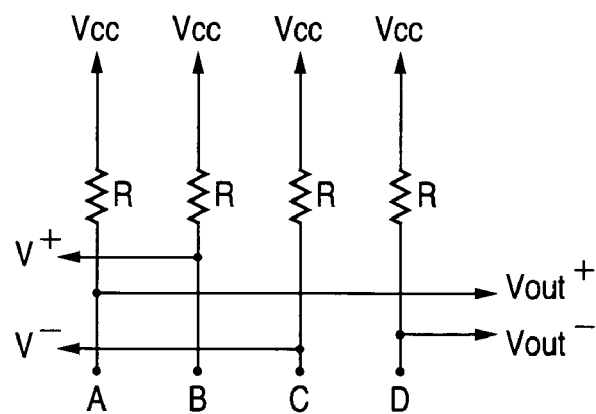
FIG. 4b is a schematic illustration showing output nodes in FIG. 4a coupling to a supply voltage Vcc through output resistors.
Figure 4A:
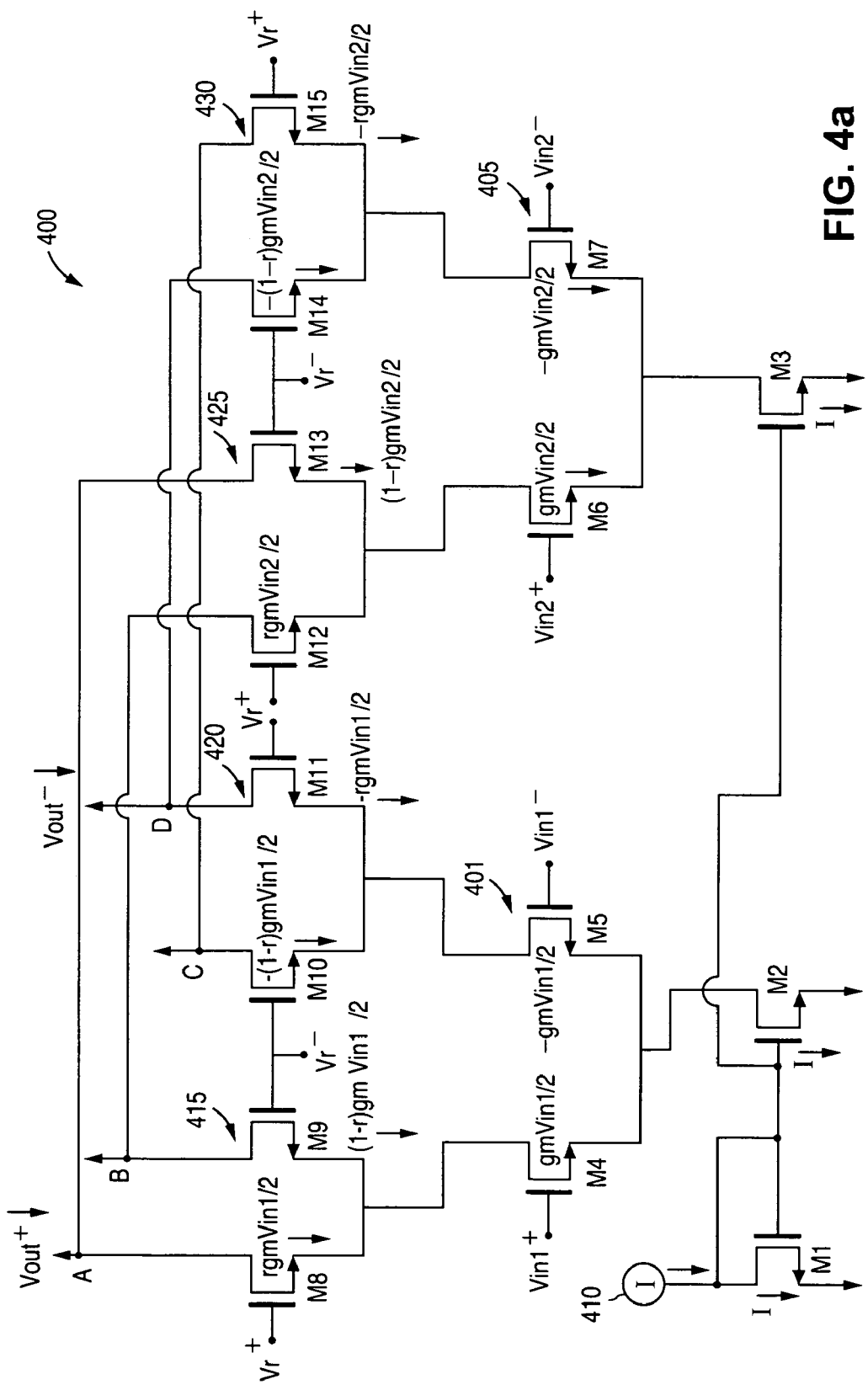
FIG. 4a is a schematic illustration of a linear interpolator according to an embodiment of the invention.

The current splitting behavior of a differential pair as determined through equation (1) may be implemented in a linear interpolator in a number of fashions. For example, FIG. 4a illustrates a linear interpolator 400 having six differential pairs of transistors. A differential pair 401 responds to an input voltage $V_{in1}$ whereas a differential pair 405 responds to an input voltage $V_{in2}$. Differential pairs 401 and 405 are each biased to provide a current I through operation of matched transistors M1 through M3. Transistor M1 is driven by a current source 410 with a current I and couples in a current mirror configuration to transistors M2 and M3 such that these transistors will also conduct a current I (or a current proportional to current I depending upon the relative channel sizes). The following discussion will assume that the channel dimensions of transistors M1 through M3 are the same such that each will conduct the same current I.

Differential pair 401 supplies the current I to transistor M2 whereas differential pair 405 supplies the current I to transistor M3. Thus, current source 410 acts to bias transistors M4 and M5 in differential pair 401 with the same gate-to-source voltage ($V_{gs}$) analogously as discussed with respect to FIG. 2. Similarly, current source 410 acts to bias transistors M6 and M7 in differential pair 405 with the same gate-to-source voltage $V_{gs}$. Thus, current source 410 sets the DC bias voltage $V_{gs}$ for transistors M4 through M7. The input voltages $V_{in1}$ and $V_{in2}$ act to alter $V_{gs}$ analogously to the operation of $V_r$ as discussed with respect to FIG. 2. In other words, input voltage $V_{in1}$ may be broken down into equal and opposite differential components $V_{in1+} = V_{cm} + V_{in1}/2$ and $V_{in1-} = V_{cm} - V_{in1}/2$ such that $V_{in1}$ equals equals ($V_{in1+} - V_{in1-}$), where $V_{cm}$ is the common mode voltage required to bias the transistors. Similarly, $V_{in2}$ may be decomposed into equal and opposite differential components $V_{in2+} = V_{cm} + V_{in2}/2$ and $V_{in2-} = V_{cm} - V_{in2}/2$ such that $V_{in2}$ equals ($V_{in2+} - V_{in2-}$). The gates of transistors M4 and M5 in differential pair 401 may be considered to receive differential input voltages $V_{in1+}$ and $V_{in1-}$, respectively. The gates of transistors M6 and M7 in differential pair 405 may be considered to receive differential input voltages $V_{in2+}$ and $V_{in2-}$, respectively.

Transistors M4 and M5 in differential pair 401 will thus each pass a current I/2 if input voltage $V_{in1}$ is zero. Similarly, transistors M6 and M7 in differential pair 405 will each pass a current I/2 if input voltage $V_{in2}$ is zero. As input voltages $V_{in1}$ and $V_{in2}$ are increased positively, more and more current will be steered to transistors M4 and M6, respectively. Using the transconductance gm for transistors M4 and M5, the current excited through each transistor in response to the input voltage $V_{in1}$ is given by $(I/2 + gm*V_{in1}/2)$ and $(I/2 - gm*V_{in1}/2)$, respectively. Similarly, the current excited through each transistor M6 and M7 in response to input voltage $V_{in2}$ is given by $(I/2 + gm*V_{in2}/2)$ and $(I/2 + gm*V_{in2}/2)$, respectively.

Since I/2 is a constant, the following discussion will ignore this current and consider only the currents induced by the input voltages $V_{in1}$ and $V_{in2}$. Since these input voltages are applied differentially, as used herein, the currents induced by the input voltages $V_{in1}$ and $V_{in2}$ shall be denoted as "differential currents." In this regard, transistor M4 conducts a differential current of $gm*V_{in1}/2$ whereas transistor M5 conducts a differential current of $-gm*V_{in1}/2$. Similarly, transistor M6 conducts a differential current of $gm*V_{in2}/2$ whereas transistor M7 conducts a differential current of $-gm*V_{in2}/2$.

The respective differential currents through transistors M4, M5, M6, and M7 may be split as discussed with respect to FIG. 2 using differential pairs 415, 420, 425, and 430, respectively. For example, differential pair 415 supplies the current conducted through transistor M4. The splitting voltage $V_r$ (equaling differential component voltages $V_{r+} - V_{r-}$) is applied across transistors M8 and M9 in differential pair 415. Thus, differential current $gm*V_{in1}/2$ is split into a portion $r*gm*V_{in1}/2$ that passes through transistor M8 and a portion $(1-r)*gm*V_{in1}/2$ that passes through transistor M9. Similarly, differential pair 420 supplies the current conducted through transistor M5. The splitting voltage $V_r$ is applied across transistors M11 and M10 in differential pair 420. Thus, differential current $-gm*V_{in1}/2$ is split into a portion $-r*gm*V_{in1}/2$ that passes through transistor M11 and a portion $-(1-r)*gm*V_{in1}/2$ that passes through transistor M10.

Differential pairs 425 and 430 split the differential currents corresponding to input voltage $V_{in2}$ in the same fashion. For example, differential pair 425 supplies the current conducted through transistor M6. The splitting voltage $V_r$ (equaling $V_{r+} - V_r$) is applied across transistors M12 and M13 in differential pair 425. Thus, differential current $gm*V_{in2}/2$ is split into a portion $r*gm*V_{in2}/2$ that passes through transistor M12 and a portion $(1-r)*gm*V_{in2}/2$ that passes through transistor M13. Similarly, differential pair 430 supplies the current conducted through transistor M7. The splitting voltage $V_r$ is applied across transistors M15 and M14 in differential pair 430. Thus, differential current $(-1)*gm*V_{in2}/2$ is split into a portion $-r*gm*V_{in2}/2$ that passes through transistor M15 and a portion $-(1-r)*gm*V_{in2}/2$ that passes through transistor M14. Note the symmetry exhibited by the differential currents in the pair of differential pairs 415 and 420 and also in the pair of differential pairs 425 and 430. For example, the differential currents through transistors M11 and M10 are the opposites of the corresponding differential currents through transistors M8 and M9, respectively.

Having split the differential currents in this fashion, they may be combined as follows to produce the desired interpolation of input voltages $V_{in1}$ and $V_{in2}$. A node A supplies the currents to transistors M8 and M13. Thus, a current $I_{out+}$ through node A equals $r*gm*V_{in1}/2 + (1-r)*gm*V_{in2}/2$. Similarly, a node D supplies the currents to transistors M11 and M14 so that a current $I_{out-}$ through node D equals $-(r*gm*V_{in1}/2 + (1-r)*gm*V_{in2}/2)$. Each node A and D may couple to a supply voltage VCC through loads such as separate resistors of equal resistances R as shown in FIG. 4b. Thus, a voltage $V_{out+}$ at node A equals VCC−R*(r*gm*$V_{in1}$/2+(1−r)*gm*$V_{in2}$/2). Similarly, a voltage $V_{out-}$ at node D equals VCC+R*(r*gm*$V_{in1}$/2+(1−r)*gm*$V_{in2}$/2). In general, loads of arbitrary impedance may be used in place of the resistors. For example, active, inductive, or capacitive loads could be used to produce the voltages $V_{out+}$ and $V_{out-}$. By combining these voltages to provide an output voltage $V_{out}$ equaling $V_{out-}-V_{out+}$, the output voltage $V_{out}$ is proportional to the desired linear interpolation of input voltages $V_{in1}$ and $V_{in2}$ such that $V_{out}$ equals k*(r$V_{in1}$+(1−r)$V_{in2}$), where k equals R*gm. Similarly, voltages $V_+$ and $V_-$ may be produced at nodes B and C, respectively. The complementary output voltage thus equals ($V_- - V_+$), which equals k*((1−r)$V_{in1}$+r$V_{in2}$). It will be appreciated that linear interpolator 400 shown in FIG. 4 is merely an exemplary embodiment that may be modified in a number of fashions. For example, MOS transistors M1 through M15 may be replaced by bipolar transistors. In addition, an alternative topology for a linear interpolator 500 is shown in FIG. 5.

Figure 5:
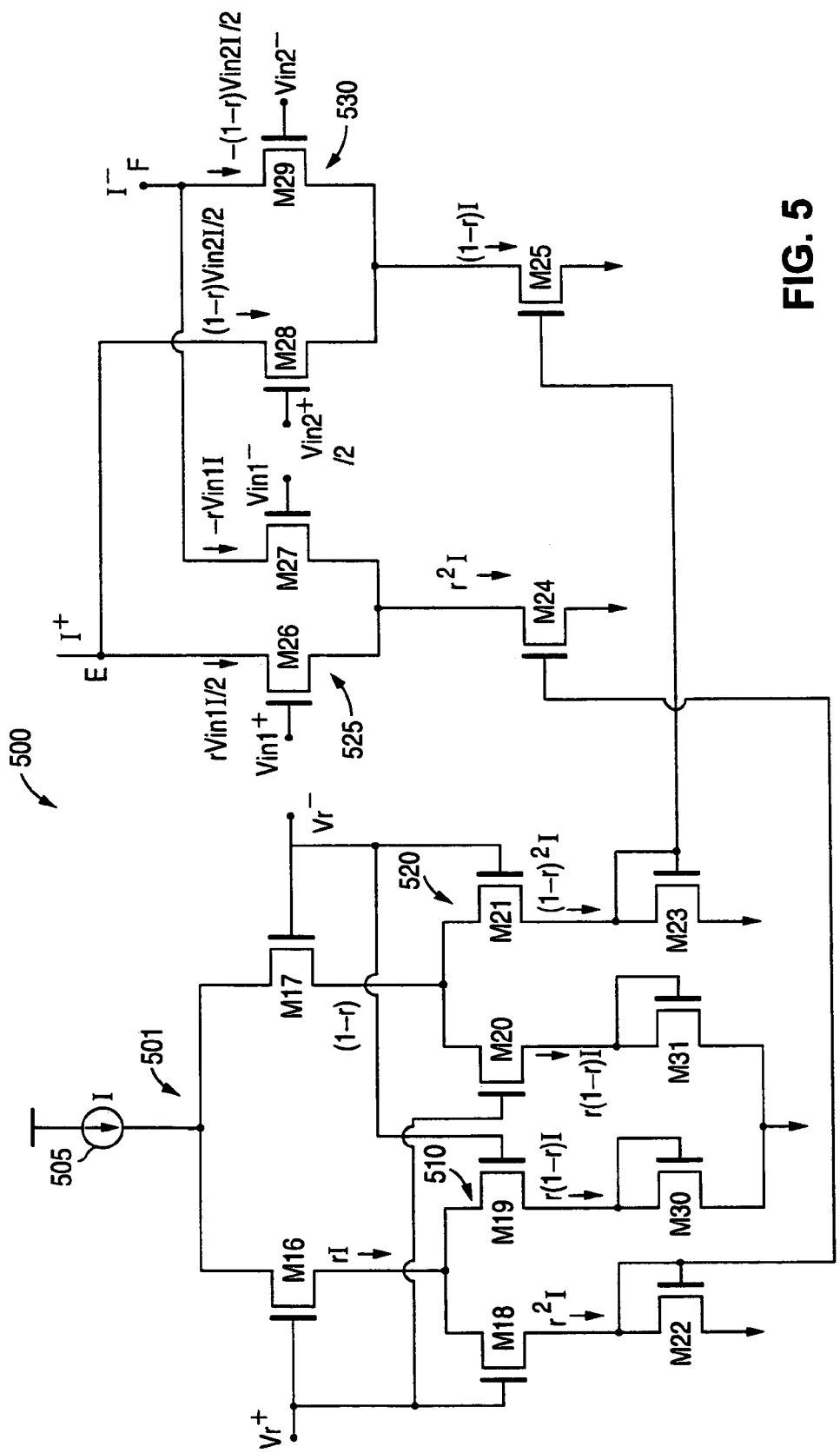
FIG. 5 is a schematic illustration of a linear interpolator according to another embodiment of the invention.

Linear interpolator 500 in FIG. 5 exploits the property of a MOS transistor wherein its transconductance is proportional to the square root of the current passed through the MOS transistor. For example, if a MOS transistor passes a current proportional to the square of the splitting factor $r^2$, its transconductance (denoted as gm) will be proportional to splitting factor r. Similarly, if a MOS transistor passes a current proportional to the square of the complement of the splitting factor $(1-r)^2$, its transconductance gm will be proportional to the complement of the splitting factor (1−r). In linear interpolator 500 of FIG. 5, a differential pair 501 splits a current I provided by a current source 505. Transistors M16 and M17 in differential pair 501 receive differential input voltages $V_{r+}$ and $V_{r-}$, respectively, as their gate voltages corresponding to splitting voltage $V_r$. Transistor M16 provides a current r*I to a differential pair 510 consisting of transistors M18 and M19. The gate of transistor M18 receives differential input voltage $V_{r+}$ whereas the gate of transistor M19 receives differential input voltage $V_{r-}$. Thus, transistor M18 will conduct a current proportional to $r^2$*I.

A corresponding current $(1-r)^2$ I may be produced as follows. Transistor M17 in differential pair 501 provides a current (1−r)I to a differential pair 520 consisting of transistors M20 and M21. Transistor M21 receives differential voltage $V_r$ as its gate voltage such that it conducts the current $(1-r)^2$I. Currents $r^2$I and $(1-r)^2$I are received at matched transistors M22 and M23. A pair of matched transistors M24 and M25 are coupled in a current-mirror configuration to matched transistors M22 and M23, respectively. Thus, transistor M24 will conduct a current equal or proportional to $r^2$I, depending upon the matching between the transistors. Similarly, transistor M25 will conduct a current equal or proportional to $(1-r)^2$I. A differential pair 525 consisting of transistors M26 and M27 provides the current to transistor M24. Similarly, a differential pair 530 consisting of transistors M28 and M29 provides the current to transistor M25. Thus, the transconductance for transistors M26 and M27 will be proportional to r whereas the transconductance for transistors M28 and M29 will be proportional to (1−r). Input voltage $V_{in1}$ is applied across transistors M26 and M27 such that the gate of transistor M26 receives differential input voltage $V_{in1+}$ whereas the gate of transistor M27 receives differential input voltage $V_{in1-}$. Similarly, input voltage $V_{in2}$ is applied across transistors M28 and M29 such that the gate of transistor M28 receives differential input voltage $V_{in2+}$ whereas the gate of transistor M29 receives differential input voltage $V_{in2-}$. In this fashion, transistors M26 and M27 conduct differential currents proportional to r*$V_{in1}$/2*I and −r*$V_{in1}$/2*I, respectively. Similarly, transistors M28 and M29 conduct differential currents proportional to (1−r)*$V_{in2}$/2*I and −(1−r)*$V_{in2}$/2*I, respectively. A node E supplies the currents to transistors M26 and M28. Similarly, a node F supplies the currents to transistors M27 and M29. Each node E and F may couple to VCC through identical resistors (not illustrated) having a resistance R in an analogous fashion discussed with respect to FIG. 4b. In general, loads of arbitrary impedance may be used in place of the resistors. For example, active, inductive, or capacitive loads could be used to couple these nodes to VCC. A voltage $V_+$ at node E is proportional to VCC−R*(r$V_{in1}$/2+(1−r)*$V_{in2}$/2). Similarly, a voltage V at node F is proportional to VCC+R*(r$V_{in1}$/2+(1−r)*$V_{in2}$/2). By combining these voltages to provide an output voltage $V_{out}$ equaling $V_- - V_+$, the output voltage $V_{out}$ is proportional to the desired linear interpolation of input voltages $V_{in1}$ and $V_{in2}$ such that $V_{out}$ is proportional to (r$V_{in1}$+(1−r)$V_{in2}$). Referring back to transistors M19 and M20, each provides a mixed current r(1−r)I. Although these mixed currents are unneeded, they are dumped to ground through diode-connected matched transistors M30 and M31, respectively, to maintain the biasing in differential pairs 510 and 520. For example, if transistor M19 passed its current directly to ground, the DC biasing for transistors M18 and M19 in differential pair 510 would be different, thereby preventing a differential pair current splitting operation as discussed with respect to FIG. 2.

Figure 6:
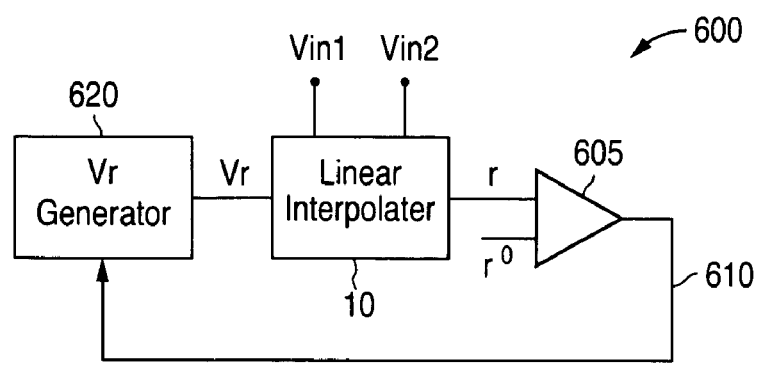
FIG. 6 is a block diagram of a linear interpolator arranged within a feedback loop according to another embodiment of the invention.

Regardless of the topology used, it will be appreciated that linear interpolators in accordance with the present invention are configurable to provide a linear interpolation of input voltages $V_{in1}$ and $V_{in2}$ according to an arbitrary splitting factor r, where $0 \leq r \leq 1$. In turn, this arbitrary splitting factor r is driven by the ratio between splitting voltage $V_r$ and the overdrive voltage as discussed with respect to FIGS. 2 and 3. As can be seen from FIG. 3, r depends non-linearly upon $V_r$, thus making it difficult to specify a straightforward mapping between $V_r$ and the desired splitting factor r. By incorporating linear interpolator 10 within a feedback loop 600 as seen in FIG. 6, the necessary level for $V_r$ to provide a desired splitting factor r may be readily achieved. From linear interpolator 10, the actual splitting factor r being used to interpolate input voltages $V_{in1}$ and $V_{in2}$ may be derived. An error amplifier 605 receives splitting factor r derived from linear interpolator 10 and compares it to a desired splitting factor $r^0$ to generate an error signal 610. A generator 620 for splitting voltage $V_r$ receives error signal 610 and adjusts the level for splitting voltage $V_r$ accordingly. For example, as can be surmised from FIG. 2, a simple negative feedback mechanism may be used to adjust $V_r$. Thus, if splitting factor r is less than $r^0$, error signal 610 is such that $V_r$ is increased. Alternatively, if splitting factor r is greater than $r^0$, error signal 610 is such that $V_r$ is decreased. In this fashion, the level of $V_r$ is adjusted until the desired splitting factor is achieved.

Although the invention has been described with respect to particular embodiments, this description is only an example of the invention's application and should not be taken as a limitation. Consequently, the scope of the invention is set forth in the following claims.

We claim:

1. An analog linear interpolator for interpolating a first input signal and a second input signal according to a factor r, wherein $0 \leq r \leq 1$, comprising:

a first multiplier operable to multiply the first input signal by the factor r to provide a first output signal equaling r*(the first input signal); and a second multiplier operable to multiply the second input signal by a complement factor (1−r) to provide a second output signal equaling (1−r)*(the second input signal).

2. The analog linear interpolator of claim 1, wherein the first input signal is a first input voltage signal $V_{in1}$ and the second input signal is a second input voltage signal $V_{in2}$.

3. The analog linear interpolator of claim 2, wherein the first and second input voltage signals $V_{in1}$ and $V_{in2}$ are differential voltage signals.

4. The analog linear interpolator of claim 1, further comprising:

an adder operable to add the first output signal and the second output signal to provide a third output signal equaling r*(the first input signal)+(1−r)*(the second input signal).

5. The analog linear interpolator of claim 4, wherein the first input signal is a first input voltage signal $V_{in1}$ and the second input signal is a second input voltage signal $V_{in2}$.

6. The analog linear interpolator of claim 5, wherein the first and second input voltage signals $V_{in1}$ and $V_{in2}$ are differential voltage signals.

* * * * *